(12) United States Patent
Matsumoto

(10) Patent No.: US 7,312,671 B2
(45) Date of Patent: Dec. 25, 2007

(54) MULTIPLIER CRYSTAL OSCILLATOR

(75) Inventor: Takashi Matsumoto, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 15 days.

(21) Appl. No.: 11/177,020

(22) Filed: Jul. 8, 2005

(65) Prior Publication Data

US 2006/0012444 A1 Jan. 19, 2006

(30) Foreign Application Priority Data

Jul. 15, 2004 (JP) .............................. 2004-208552

(51) Int. Cl.
*H01P 3/08* (2006.01)
*H03B 5/32* (2006.01)
(52) U.S. Cl. .................... 331/158; 331/108 D; 333/247
(58) Field of Classification Search ................ 331/158, 331/108 D
See application file for complete search history.

(56) References Cited

U.S. PATENT DOCUMENTS

| 4,792,773 A | 12/1988 | Bert et al. |
| 5,373,112 A | 12/1994 | Kamimura et al. |
| 2004/0238950 A1* | 12/2004 | Doan ........................ 257/734 |
| 2005/0221600 A1* | 10/2005 | Daamen et al. ............. 438/622 |

FOREIGN PATENT DOCUMENTS

| EP | 0 437 976 A3 | 7/1991 |
| EP | 0 437 976 B1 | 8/1995 |
| JP | 2002-57527 | 2/2002 |
| JP | 2002057527 A | 2/2002 |

OTHER PUBLICATIONS

European Search Report dated Dec. 2, 2005.

* cited by examiner

*Primary Examiner*—Joseph Chang
(74) *Attorney, Agent, or Firm*—Scott D. Wofsy; Edwards Angell Palmer & Dodge LLP

(57) ABSTRACT

The present invention has a configuration such that in a multiplier crystal oscillator wherein a multilayer board having earthing metal films on both principal planes of an intermediate board, and mount boards laminated on both sides thereof, and at least one multiplier LC filter is arranged on one principal plane of the laminated board, an opening is provided in the earthing metal film that is provided on one principal plane of the intermediate board opposed to an arrangement region of the LC filter, and a ground of the intermediate board is exposed. An object of the present invention is to provide a multiplier oscillator wherein particularly the displacement and irregularity of the multiple frequencies serving as the output frequency is prevented, and furthermore spurious oscillations are suppressed.

7 Claims, 4 Drawing Sheets

MULTIPLIER CRYSTAL OSCILLATOR

BACKGROUND OF THE INVENTION

1. Technical Field

The present invention relates to a multiplier crystal oscillator (hereunder, called "multiplier oscillator") which uses an LC filter, and in particular relates to a multiplier oscillator where circuit elements are arranged on a laminated board.

2. Background Art

A crystal oscillator is installed into various electronic equipment as a reference source for frequency and time. In particular, since optical communication and the like is coming to the fore, there is progress towards higher frequencies, for example oscillating frequencies of 622 MHz. As one such oscillator, there is a multiplier oscillator where the harmonics of the oscillating frequency of the crystal oscillator are selected by an LC filter.

PRIOR ART

FIG. 4 illustrates a conventional example of this type of multiplier oscillator, wherein FIG. 4A is a schematic circuit diagram of the multiplier oscillator, and FIG. 4B is a vertical cross-sectional diagram of a multilayer board thereof.

As shown in FIG. 4A, the multiplier oscillator basically comprises an oscillation circuit 1 and a multiplication circuit 2. The oscillation circuit 1 is for example a Colpitts type, comprising a resonance circuit 3, and an oscillation amplifier 4. The resonance circuit 3 comprises a crystal vibrator 5 as an inductor component, and split capacitors C1 and C2. The oscillation amplifier 4 is for example a transistor, and is connected to the resonance circuit 3 for feedback amplification of the oscillating frequency f0.

Here, the oscillating frequency f0 is mainly dependent on the resonance circuit 3. Strictly speaking, it is determined by the series capacitance (so-called, load capacity CL) on the circuit side viewed from the crystal vibrator 5. Here, the oscillating frequency f0 is set to 155 MHz. In such an oscillation circuit 1, as shown in the frequency spectrum (not shown), the harmonic components f2, f3, . . . , fn are generated with respect to the fundamental wave component f1 (f0=f1) of the oscillating frequency f0.

Moreover, as shown in FIG. 4A, the multiplication circuit 2 is connected to the collector side of the oscillation amplifier 4, and LC filters 6 (6a, 6b, and 6c) are connected on multistages. The LC filters comprises an inductor L and a capacitor C both of which are formed into a chip-shape. However, the LC filter of the last stage comprises split capacitors C1 and C2. Here, three LC filters 6a, 6b, and 6c are connected in multistages to steepen the attenuation gradient of the filter characteristic.

Moreover, the respective LC filters 6a, 6b, and 6c are set to a value (622 MHz) that is syntonic with, for example the quadruple wave f4, among the harmonic components fn of the oscillating frequency f0. The respective LC filters 6a, 6b, and 6c are connected in a high frequency manner by a coupling capacitor C3. Moreover, an output frequency (multiple frequency) f0', the voltage of which is divided between the split capacitors C1 and C2 of the last stage, is obtained. In FIG. 4A, reference symbols R1, R2 and R3 denote bias resistors, C3 denotes a bypass capacitor, Vcc denotes a power source, and Vout denotes the output.

As shown in FIG. 4B, normally, the respective chip-shaped circuit elements 7 including the LC filters 6a, 6b, and 6c are provided on both principal planes of the multilayer board 8. Each part of the multilayer board 8 is made from a glass epoxy material. The multilayer board 8 comprises mount boards 8b and 8c laminated on both surfaces of the intermediate board 8a. Earthing metal films 9a and 9b are formed on both principal planes of the intermediate board 8a, so as to prevent electrical coupling between both principal planes of the multilayer board 8. Since the earthing metal films 9a and 9b are bent if they are formed on only one principal plane of the intermediate board 8a, they are formed on both principal planes thereof (see Japanese Laid-Open Patent Publication No. 2002-57527).

However, in the conventional multiplier oscillator having the abovementioned configuration, there has been a problem in that the output frequency (multiple frequency) f0' is particularly displaced to the lowpass side and becomes irregular. That is, the earthing metal films 9a and 9b are formed on the intermediate board 8a, and the earthing metal films 9a and 9b and the power source Vcc shown in FIG. 4A have the same potential in a high frequency manner. As a result the respective filters 6a, 6b, and 6c are connected in multistages. Therefore, as shown in FIG. 5 (partially enlarged vertical cross-sectional view of the multilayer board 8), a stray capacity Ca' is generated between the respective LC filters 6a, 6b, and 6c and the earthing metal films 9a and 9b, and this stray capacity is connected to the LC filters 6 (6a, 6b, and 6c) in parallel, so that the stray capacity is added to the capacity value of the capacitor C.

Here, the stray capacity Ca' is generated between mounted terminals 10 (see to FIG. 5) of the inductor and the capacitor formed in a chip-shape constituting the LC filter, and a circuit pattern (conduction path) (not shown) connecting them, and furthermore between the conduction path from the connection terminals, and the earthing metal films 9a and 9b and the like. Among these, since the area of the surface mounted terminals of the inductor and the capacitor is large, the stray capacity due thereto is the highest. In FIG. 4A, the stray capacity Ca is entered only for the LC filter 6 (6a) of the first stage.

Consequently, there has been a problem in that the syntonic frequency of the LC filters 6a, 6b, and 6c is decreased so that the multiple frequency f0' is displaced to the lowpass side. Moreover, since the stray capacity Ca, Ca' changes depending on the structure of the oscillator and the environment such as surrounding humidity, there has been a problem in that the multiple frequency f0' serving as the output, also becomes irregular.

Moreover, as shown in FIG. 4A, a stray capacity Cb is added to between the input/output terminals XY of the LC filters 6 (6a, 6b, and 6c) that are connected in multistages. Therefore, originally the filter characteristic is such that the attenuation is saturated as shown by the curved line "a" in FIG. 6, whereas the characteristic becomes such that an attenuation pole P is generated on the highpass side by the stray capacity Cb, and the attenuation is decreased in the frequency thereafter as shown by the curved line "b" in FIG. 6. Consequently, there has also been a problem in that noise is not suppressed on the highpass side, and spurious oscillations occur.

An object of the present invention is to provide a multiplier oscillator wherein particularly the displacement and irregularity of the multiple frequencies serving as the output frequency is prevented, and furthermore spurious oscillations are suppressed.

SUMMARY OF THE INVENTION

The present invention has a configuration such that in a multiplier crystal oscillator wherein a multilayer board comprising earthing metal films formed on both principal planes of an intermediate board, and mount boards laminated on both sides thereof, and at least one multiplier LC filter arranged on one principal plane of the laminated board, an opening is provided in the earthing metal film that is provided on one principal plane of the intermediate board opposed to an arrangement region of the LC filter, and a ground of the intermediate board is exposed.

According to such a configuration, the earthing metal film of one principal plane of the intermediate board opposed to the arrangement region of the LC filter has an opening to expose the ground of the intermediate board. Consequently, the earthing metal film opposed to the arrangement region of the LC filter becomes the other principal plane of the intermediate board, and the stray capacity is decreased by elongating the distance therebetween. Therefore, the change of the syntonic frequency to the lowpass side in the LC filter can be decreased, and the displacement and irregularity of the multiple frequency serving as the output frequency from the crystal oscillator can be minimized.

Moreover, in the present invention, the opening is a region enclosing a periphery including a circuit pattern that connects respective chip elements of the LC filter. As a result the stray capacity generated between the LC filter including the circuit pattern that connects the capacitor and the inductor, and the earthing metal film can be minimized.

Furthermore, in the present invention, the opening is formed in a region enclosing a periphery of respective chip elements constituting the LC filter. As a result the stray capacity generated between the respective chip elements constituting the LC filter can be decreased. Moreover, since the opening of one principal plane of the intermediate board is decreased, the area where the earthing metal film is removed can also be decreased, so that the symmetric property between both principal planes can be made good, and bending or the like of the multilayer board can be prevented.

In addition, in the present invention, the opening is formed in a region enclosing a periphery of a surface mounted terminal of respective chip elements constituting the LC filter. As a result, the stray capacity generated between the respective chip elements having a particularly large electrode surface area, and the mounted terminal can be decreased. Furthermore, the symmetric property of the earthing metal film between both principal planes can be made good, and bending or the like of the multilayer board can be prevented.

Furthermore, the present invention has a configuration such that a plurality of the LC filters are connected in multistages, an opening is are formed in the earthing metal film provided on one principal plane of the intermediate board opposed to an arrangement region of the plurality of LC filters, and a ground of the intermediate board is exposed. As a result the attenuation gradient of the characteristic of the filters connected in multistages is increased, and similarly to the abovementioned case, the displacement and irregularity of the multiple frequencies can be prevented.

Moreover, the stray capacity generated between the output of the LC filters connected in multistages, and the power source which becomes earthed in a high frequency manner can be decreased, the generation of the attenuation pole can be prevented, and the compensatory attenuation out of the bandpass can be maintained, so as to suppress the occurrence of spurious oscillations.

BRIEF DESCRIPTION OF THE DRAWINGS

FIG. 1 illustrates an embodiment of a multiplier oscillator of the present invention, wherein

FIG. 4 illustrates a multiplier oscillator of a conventional example, wherein

DETAILED DESCRIPTION OF THE PREFERRED EMBODIMENT

Embodiment

Figure 1A:
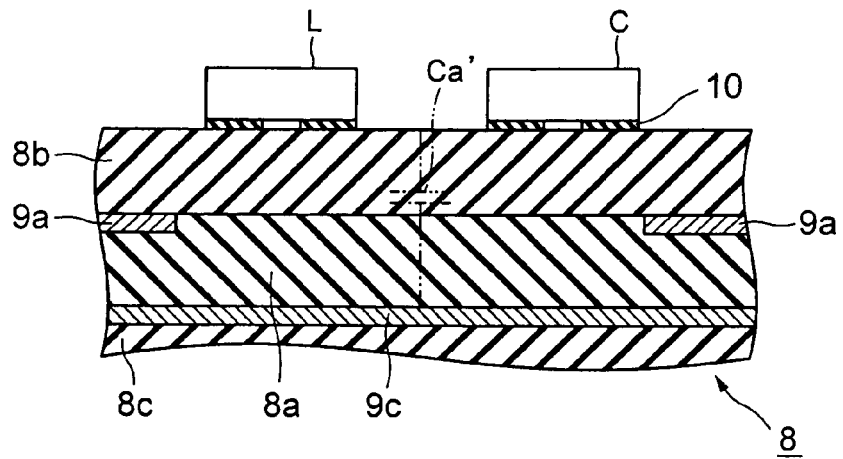
FIG. 1A is a partial cutaway cross-sectional view.
Figure 1B:
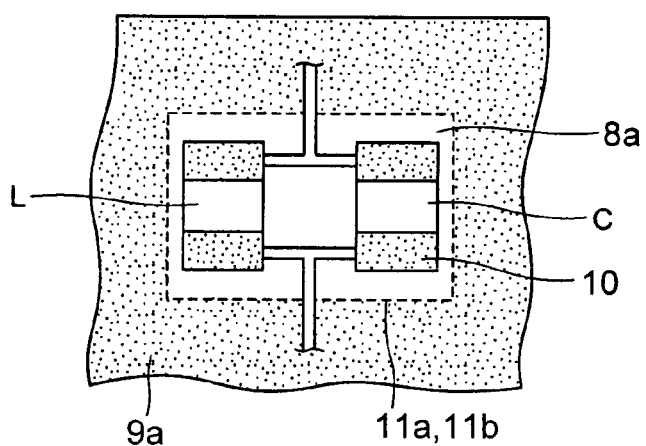
FIG. 1B and FIG. 1C are partial cutaway plan views.
Figure 1C:
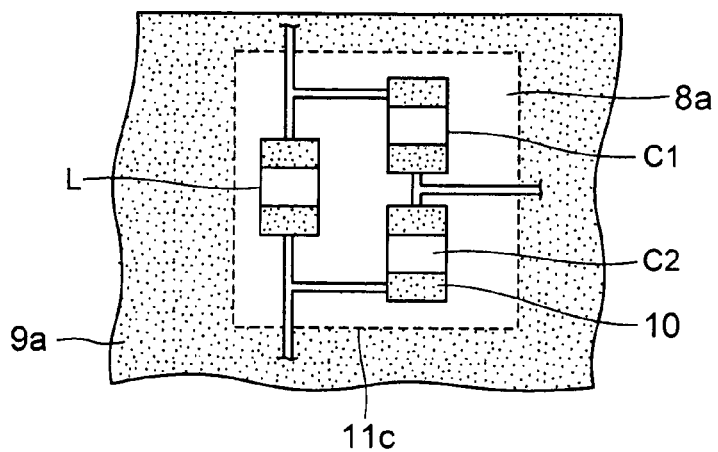

FIG. 1 illustrates an embodiment of a multiplier oscillator of the present invention, wherein FIG. 1A is a partial cutaway cross-sectional view, and FIG. 1B and FIG. 1C are partial cutaway plan views.

Figure 4A:
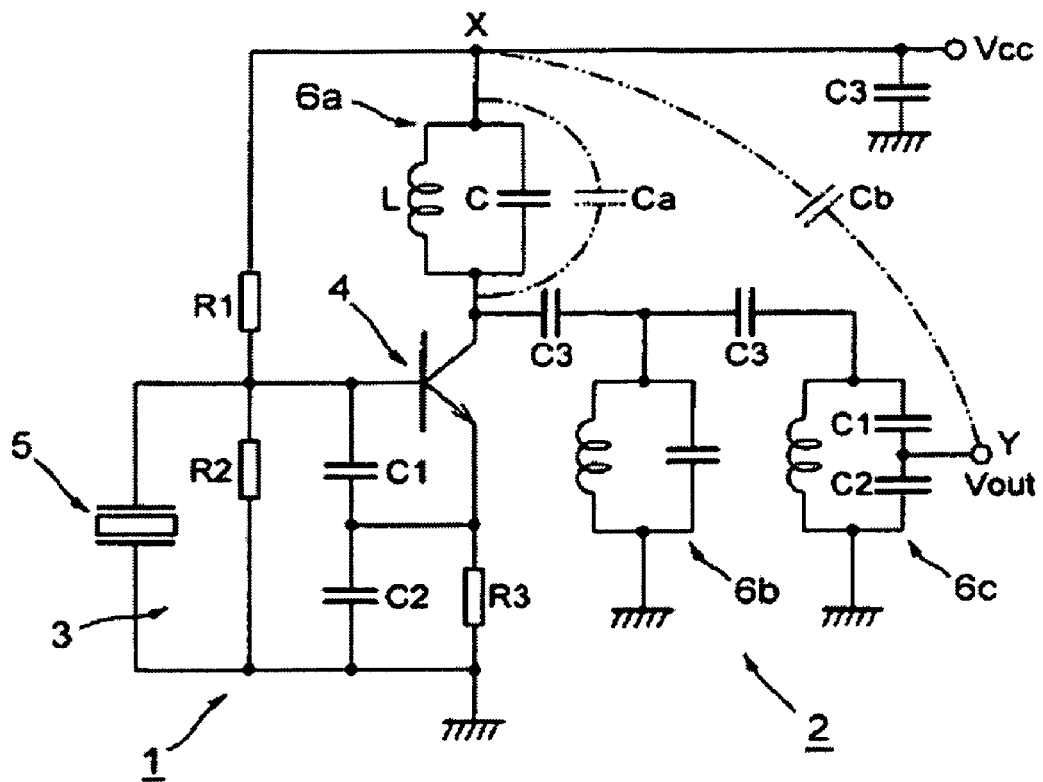
FIG. 4A is a schematic circuit diagram.
Figure 4B:
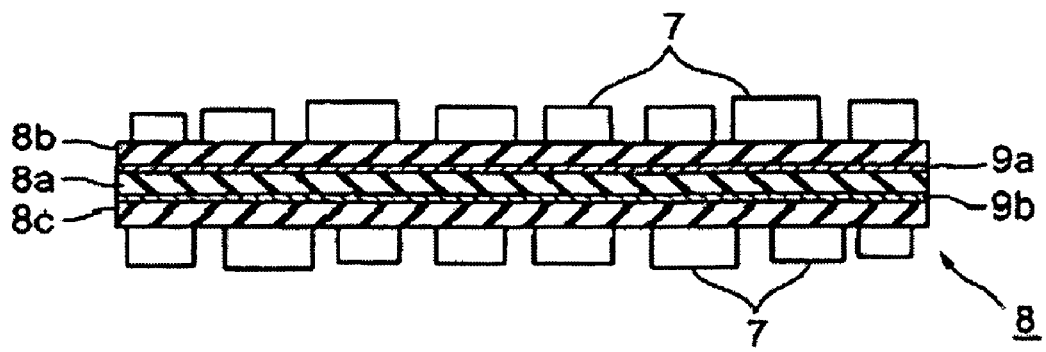
FIG. 4B is a vertical cross-sectional view thereof.
Figure 5:
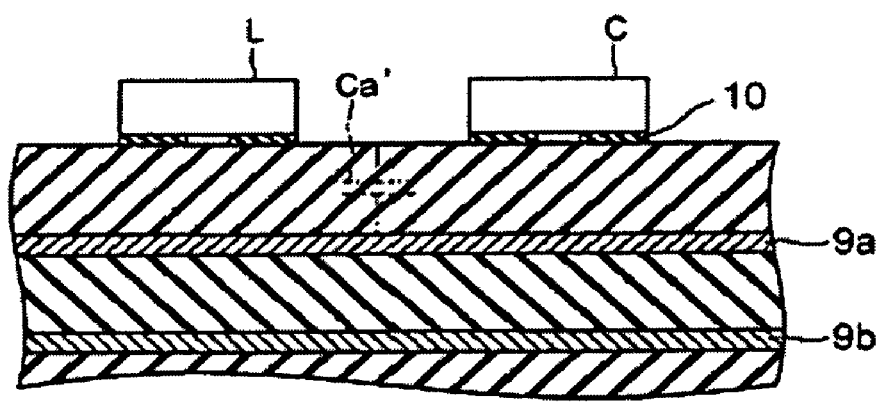
FIG. 5 is a partial cutaway cross-sectional view that illustrates the multiplier oscillator of the conventional example.

As described above, the multiplier oscillator of the present invention (see FIG. 4A) comprises: an oscillation circuit 1 having a resonance circuit 3 with a crystal vibrator 5 as an inductor component, and an oscillation amplifier 4; and a multiplication circuit 2 having LC filters 6 (6a, 6b, and 6c) that are connected in multistages. Moreover, as shown in FIG. 1A, a multilayer board 8 comprises earthing metal films 9 formed on both principal planes of an intermediate board 8a, and mount boards 8b and 8c laminated on both sides thereof. Respective circuit elements 7 including LC filters 6 (6a, 6b, and 6c) are provided on the multilayer board 8.

Moreover, the respective LC filters 6 (6a, 6b, and 6c) are arranged on one principal plane (the mount board 8b on one side) of the laminated board 8. As shown in FIG. 1A, openings 11 are respectively provided in the earthing metal film 9a that is provided on one principal plane of the intermediate board 8a opposed to the mount board 8b on one side, being opposed to the arrangement regions of the respective LC filters 6 (6a, 6b, and 6c). The ground of the intermediate board 8a of the laminated board 8 is exposed in the openings 11a, 11b, and 11c, and any non-metal film is not present here.

Here, the openings 11a, 11b, and 11c, in other words, the arrangement region of the respective LC filters 6a, 6b, and 6c, is the region enclosing the periphery including the circuit pattern 12 that connects the chip-shaped inductor L and the capacitor C respectively constituting the LC filter.

FIG. 1A is a partial cutaway cross-sectional view and FIG. 1B is a partial cutaway plan view opposed to the LC filters 6a and 6b of the first and the second stages. FIG. 1C is a partial cutaway plan view corresponding to the LC filter 6c of the third stage. In the drawings, the mount board 8b on one side is not shown.

According to such a configuration, the respective LC filters 6a, 6b, and 6c are opposed to the earthing metal film 9b on the other principal plane of the intermediate board 8a.

Therefore, since the distance between the earthing metal film 9b and the LC filters 6a, 6b, and 6c can be elongated, a stray capacity Ca' connected to the respective LC filters 6a, 6b, and 6c in parallel becomes smaller than the conventional stray capacity.

As a result, the effect of the stray capacity Ca' can be decreased, and the change of the syntonic frequency to the lowpass side in the respective LC filters 6a, 6b, and 6c can be prevented. Consequently, displacement of the multiple frequency f0' serving as the output frequency, to the low pass side can be prevented. Moreover, since the stray capacity Ca can be decreased, the change is also small, so that the irregularity of the multiple frequency f0 can also be prevented.

Figure 6:
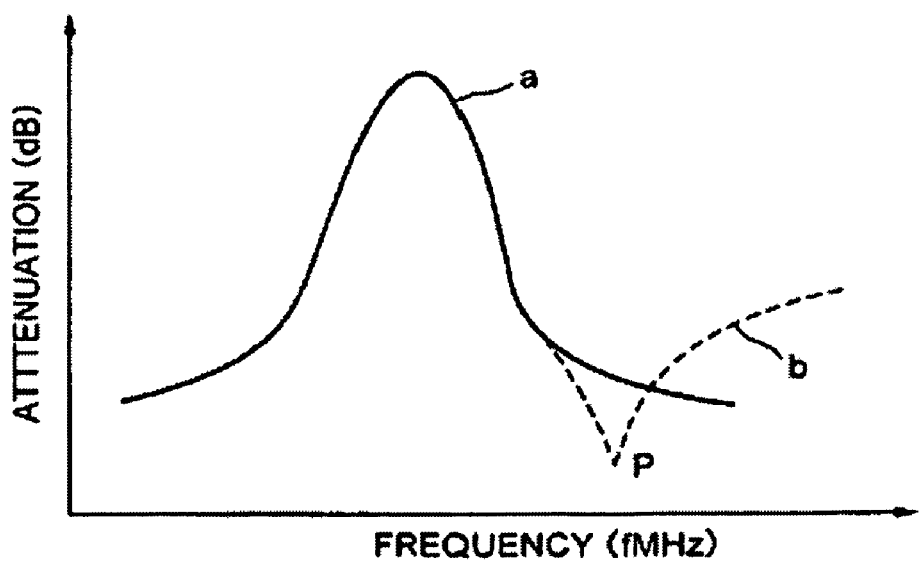
FIG. 6 shows the filter characteristic of the multiplier oscillator of the conventional example.

Furthermore, the stray capacity Cb (see FIG. 4A) between the inductor L of the LC filter 6a of the last stage, and the end connection serving as the output terminal side of the split capacitors C1 and C2, and the earthing metal film 9b, also becomes smaller. Consequently, the generation of the attenuation pole P shown in FIG. 6 can be prevented, the attenuation out of the bandpass can be increased, and the occurrence of spurious oscillations can be suppressed.

Figure 2:
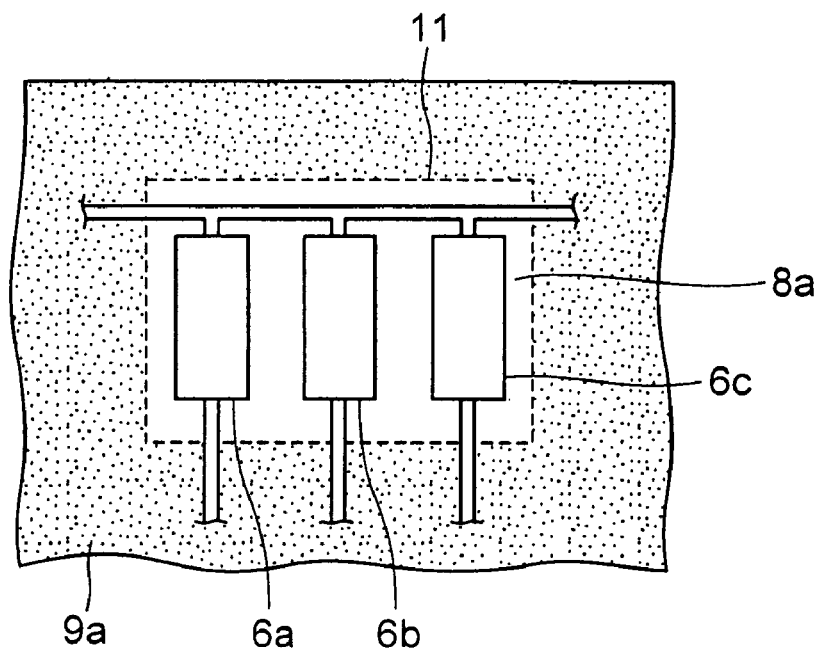
FIG. 2 is a partial cutaway plan view that illustrates another embodiment of the multiplier oscillator of the present invention.

In the embodiment described above, there are provided the openings 11a, 11b, and 11c respectively opposed to the arrangement regions of the respective LC filters 6a, 6b, and 6c. However, as shown in FIG. 2, an opening 11 may be provided on an arrangement region including the circuit pattern that connects the LC filters 6a, 6b, and 6c. In this case, the stray capacity caused by the circuit pattern that connects the LC filters 6a, 6b, and 6c can also be decreased. Therefore the effect of preventing the displacement or the like of the multiple frequency f0' can also be increased.

Figure 3:
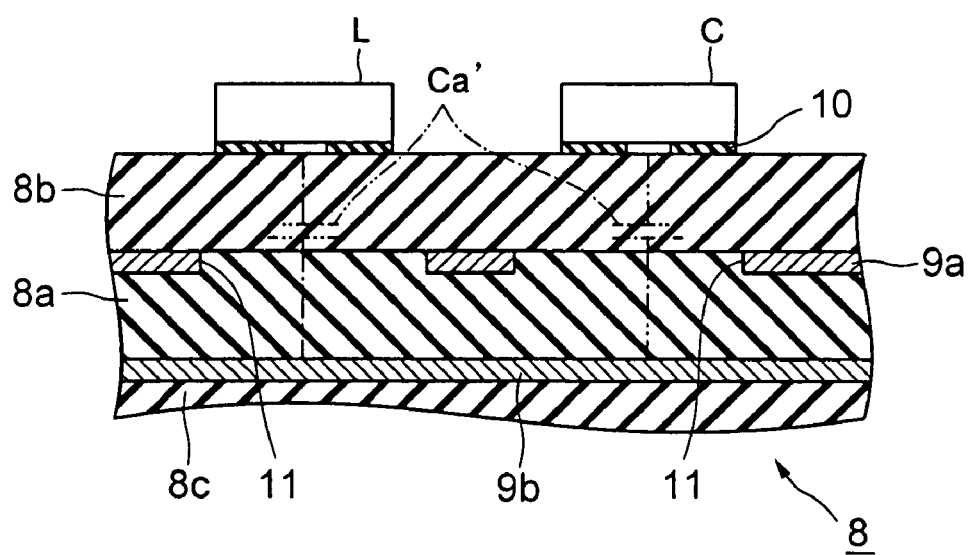
FIG. 3 is a partial cutaway cross-sectional view that illustrates yet another embodiment of the multiplier oscillator of the present invention.

Moreover, as shown in FIG. 3, there may be provided the openings 11 respectively opposed to each of the inductor and the capacitor constituting the respective LC filters 6a, 6b, and 6c. Furthermore, the openings 11 may be provided in each region enclosing the periphery of the surface mounted terminal of each chip element. In such cases, an effect similar to the abovementioned effect is demonstrated.

In the present embodiment, three of the LC filters 6 are connected in multistages. However, a similar effect is demonstrated even if two or four LC filters 6 or more are connected. On the other hand, displacement and changing of the multiple frequencies can be prevented, even if there is only one LC filter 6. The present embodiment has been described with simply a multiplier oscillator. However, there is also a similar effect with a multiplier type voltage controlled oscillator. Moreover, oscillation amplifiers may be connected in cascade.

What is claimed is:

1. A multiplier crystal oscillator comprising:
   a multilayer board having earthing metal films on both principal planes of an intermediate board, and mount boards laminated on both sides of the intermediate board, wherein both the intermediate board and mount boards are made of a glass epoxy material; and
   at least one multiplier LC filter arranged in an arrangement region on one principal plane of said laminated board, wherein:
   the earthing metal film provided on one principal plane of said intermediate board opposed to the arrangement region of said LC filter has an opening defined therein, corresponding to a region enclosing a periphery of a surface mounted terminal of respective chip elements constituting said LC filter, thereby exposing a ground of said intermediate board, while inhibiting bending of the intermediate board; and wherein
   the material of the intermediate board extends into the opening defined in the earthing metal film.

2. A multiplier crystal oscillator comprising:
   a multilayer board having earthing metal films on both principal planes of an intermediate board, and mount boards laminated on both sides of the intermediate board, wherein both the intermediate board and mount boards are made of a glass epoxy material; and
   at least one multiplier LC filter arranged in an arrangement region on one principal plane of said laminated board, wherein
   the earthing metal film provided on one principal plane of said intermediate board opposed to the arrangement region of said LC filter, has a plurality of openings defined therein corresponding to regions enclosing respective peripheries of individual chip elements constituting said LC filter, while inhibiting bending of the intermediate board; and wherein
   the material of the intermediate board extends into the openings defined in the earthing metal film.

3. The multiplier crystal oscillator of claim 2, wherein the openings are provided in regions corresponding to the periphery of a surface mounted terminal of each chip element constituting said LC filter.

4. The multiplier crystal oscillator of claim 1, wherein the material of the intermediate board completely fills a space left by the opening defined in the earthing metal film.

5. The multiplier crystal oscillator of claim 2, wherein the material of the intermediate board completely fills spaces left by the openings defined in the earthing metal film.

6. The multiplier crystal oscillator of claim 1, wherein the opening is defined in the earthing metal film on the principal plane of the intermediate board closest to said multiplier LC filter, and wherein the earthing metal film on the principal plane of the intermediate board farthest from said multiplier LC filter remains intact in an area corresponding to the opening.

7. The multiplier crystal oscillator of claim 2, wherein the openings are defined in the earthing metal film on the principal plane of the intermediate board closest to said multiplier LC filter, and wherein the earthing metal film on the principal plane of the intermediate board farthest from said multiplier LC filter remains intact in an area corresponding to the openings.

* * * * *